(12) United States Patent
Zhu et al.

(10) Patent No.: US 10,908,246 B2
(45) Date of Patent: Feb. 2, 2021

(54) METHOD FOR THREE-DIMENSIONAL RECONSTRUCTION OF FASCICULAR STRUCTURE OF HUMAN PERIPHERAL NERVE

(71) Applicant: THE FIRST AFFILIATED HOSPITAL OF SUN YAT-SEN UNIVERSITY, Guangdong (CN)

(72) Inventors: Qingtang Zhu, Guangdong (CN); Jian Qi, Guangdong (CN); Liwei Yan, Guangdong (CN); Zhi Yao, Guangdong (CN); Xiaolin Liu, Guangdong (CN)

(73) Assignee: THE FIRST AFFILIATED HOSPITAL OF SUN YAT-SEN UNIVERSITY, Guangzhou (CN)

( * ) Notice: Subject to any disclaimer, the term of this patent is extended or adjusted under 35 U.S.C. 154(b) by 34 days.

(21) Appl. No.: 16/379,787

(22) Filed: Apr. 9, 2019

(65) Prior Publication Data

US 2019/0235039 A1  Aug. 1, 2019

Related U.S. Application Data

(63) Continuation of application No. PCT/CN2018/084724, filed on Apr. 27, 2018.

(30) Foreign Application Priority Data

Dec. 1, 2017  (CN) .......................... 2017 1 1248734

(51) Int. Cl.
*G01R 33/54* (2006.01)
*G01R 33/30* (2006.01)
(Continued)

(52) U.S. Cl.
CPC .......... *G01R 33/543* (2013.01); *G01N 24/08* (2013.01); *G01R 33/30* (2013.01);
(Continued)

(58) Field of Classification Search
CPC .. G01R 33/543; G01R 33/5608; G01R 33/30; G06T 17/10; G06T 17/00; G06T 11/003; G01N 24/08
See application file for complete search history.

(56) References Cited

U.S. PATENT DOCUMENTS

2015/0032137 A1* 1/2015 Wagner .............. A61B 17/1128
606/152
2017/0135802 A1* 5/2017 McAlpine ........... A61L 27/3878
(Continued)

FOREIGN PATENT DOCUMENTS

CN  105559750 A  5/2016
CN  105913490 A  8/2016

*Primary Examiner* — Dixomara Vargas

(57) ABSTRACT

The present invention provides a method for three-dimensional reconstruction of fascicular structure of human peripheral nerve, which comprises the steps of: obtaining human peripheral nerve and preparing a peripheral nerve sample; immersing the peripheral nerve sample into a liquid; setting scan parameters of Micro-MRI, scanning the peripheral nerve sample by Micro-MRI, to acquire image data of the peripheral nerve sample in the liquid environment; and three-dimensional reconstructing a structural model of the peripheral nerve sample based on the image data. By means of the method according to the present invention, high-quality scanned images are obtained without destroying the morphology and physical and chemical properties of peripheral nerve, so as to obtain a precise three-dimensional visualization model of peripheral nerve fascicle.

8 Claims, 3 Drawing Sheets

(51) Int. Cl.
  *G06T 17/10*     (2006.01)
  *G06T 11/00*     (2006.01)
  *G01N 24/08*     (2006.01)
  *G06T 17/00*     (2006.01)
  *G01R 33/56*     (2006.01)

(52) U.S. Cl.
  CPC ........ *G01R 33/5608* (2013.01); *G06T 11/003* (2013.01); *G06T 17/00* (2013.01); *G06T 17/10* (2013.01); *G06T 2207/10088* (2013.01); *G06T 2207/30004* (2013.01); *G06T 2210/41* (2013.01)

(56) References Cited

U.S. PATENT DOCUMENTS

| | | | |
|---|---|---|---|
| 2017/0192076 A1* | 7/2017 | Kerins | G01R 33/4806 |
| 2017/0325880 A1* | 11/2017 | Gertner | A61B 18/1492 |
| 2018/0018816 A1* | 1/2018 | Yan | G06T 15/04 |
| 2018/0031663 A1* | 2/2018 | Borsook | G01R 33/56341 |
| 2018/0113186 A1* | 4/2018 | Kerins | G01R 33/58 |

\* cited by examiner

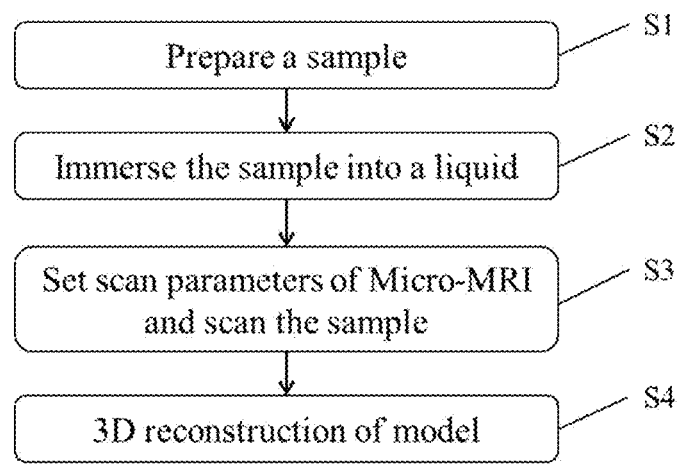
FIG. 1
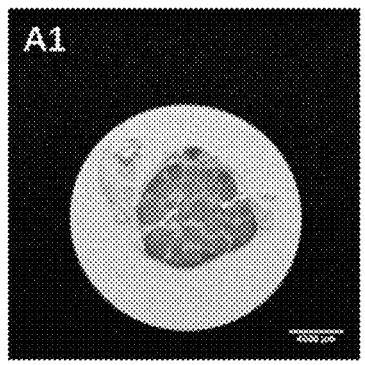
FIG. 2A1
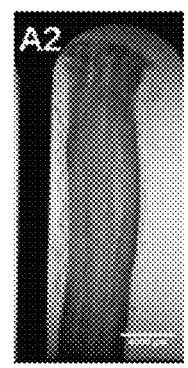
FIG. 2A2
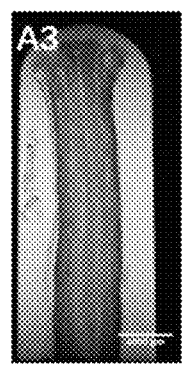
FIG. 2A3
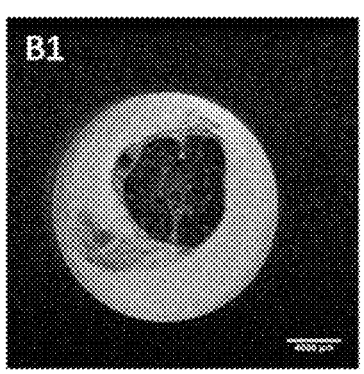
FIG. 2B1
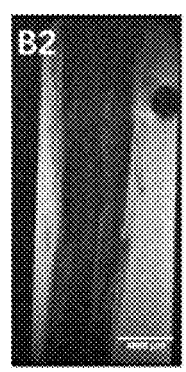
FIG. 2B2
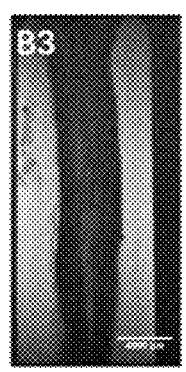
FIG. 2B3

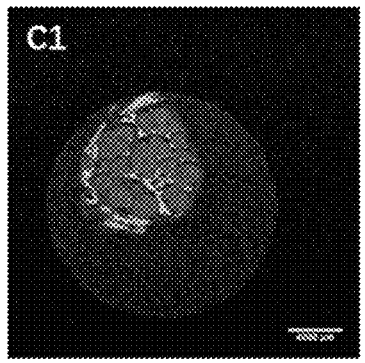
FIG. 2C1
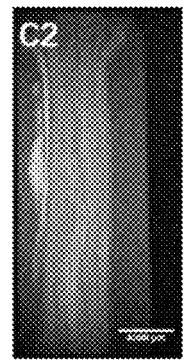
FIG. 2C2
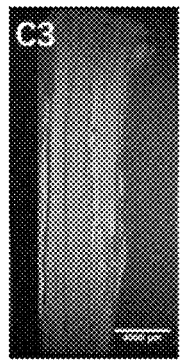
FIG. 2C3
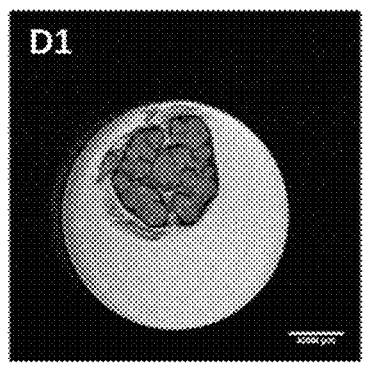
FIG. 2D1
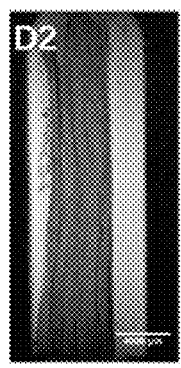
FIG. 2D2
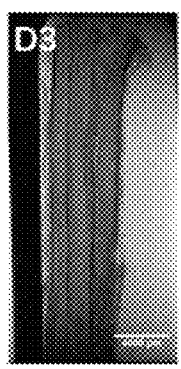
FIG. 2D3
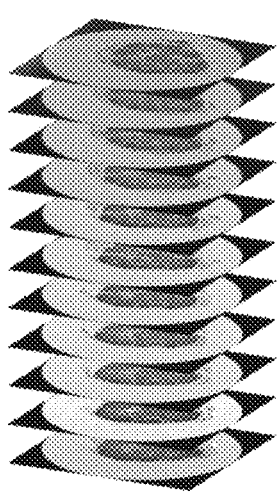
FIG. 3A
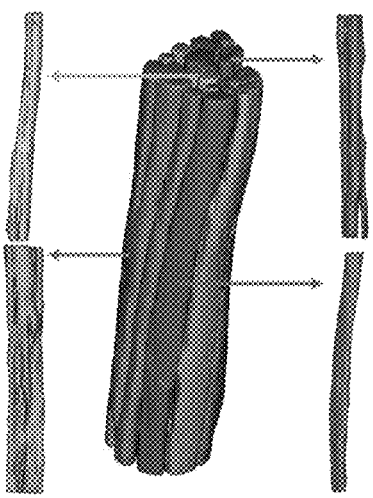
FIG. 3B
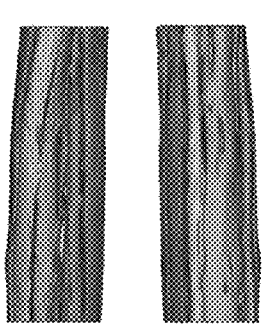
FIG. 3C

METHOD FOR THREE-DIMENSIONAL RECONSTRUCTION OF FASCICULAR STRUCTURE OF HUMAN PERIPHERAL NERVE

CROSS REFERENCE TO RELATED APPLICATION

This application is a Continuation Application of PCT Application No. PCT/CN2018/084724 filed on Apr. 27, 2018, which claims priority of Chinese Patent Application No. 201711248734.1 filed on Dec. 1, 2017. The entire contents of all the above are hereby incorporated by reference.

TECHNICAL FIELD

The present invention relates to the technical filed of clinical application of repairing of nerve defects, and particularly to a method for three-dimensional reconstruction of fascicular structure of human peripheral nerve.

BACKGROUND

The fascicular structure of peripheral nerve is quite complicated and variable, a complete, clear, accurate and rapid identification for which has not been achieved in the current research. Development and standardization of the corresponding research technology are particularly important as the identification has a significant implication in the clinical and scientific studies. The research on the fascicular structure has important value of guidance for the surgical design and improvement of surgical outcomes in clinically repairing peripheral nerve injury, including microsurgery, oral and maxillofacial surgery and the like. In the field of regenerative medical science, with the rise of the concept of precision medicine and the rapid development of 3D printing technology, information based on the fascicular structure can provide a mathematical model for the design of nerve stents, making it possible for 3D printing of personalized nerve grafts.

For the study of fascicular structure of peripheral nerve, 3D reconstruction visualization combined with microscopic anatomy, histochemical staining and serial sectioning etc. remains to be the popular method at present. Among them, the most reported histochemistry of functional fascicle of peripheral nerve includes mainly cholinesterase histochemistry, carbonic anhydrase staining, choline acetyltransferase (ChAT) immunohistochemistry and the like. For more than ten years, with the continuous development of computer software and hardware, the ability to reconstruct medical three-dimensional images using computers has been rapidly developed. Some scholars have made intensive attempts on the three-dimensional reconstruction of the anatomy of the interior of peripheral nerve based on serial tissue slices of the peripheral nerve. More precise and accurate images of the nerve slices can be obtained from the serial slices of the stained tissue than from the microscopic anatomy. However, this method also requires more manual operations in image registration and contour acquisition, which not only increases the work intensity, but also reduces the accuracy of the three-dimensional reconstruction of the nerve fascicle.

In recent years, the new advances in the emerging medical imaging technologies Micro-CT and Micro-MRI have brought new ideas for technological breakthroughs in the study of fascicular structure. It has been reported that the nerve is pretreated with an iodine agent in combination with freeze drying; and then two-dimensional images of the interior of peripheral nerve are obtained by Micro-CT. However, in fact, after pretreatment of the nerve by the iodine agent combined with freeze drying, the nerve is inevitably deformed and its physical and chemical properties are also changed, making it difficult to be used in other studies. Emerging medical imaging technology provides more means for obtaining the topological structure of peripheral nerve. However, this does not mean that the traditional histological methods will be completely replaced. There remains a need for better integration of the structural information obtained by various methods in the future research. Therefore, if the consecutively scanned images of the fascicular structure can be precisely reconstructed, while the deformation of the samples can be minimized so the same samples can be reused, then the obtaining of a more precise nerve fascicular topology can be facilitated.

Micro-MRI has also been used as a new imaging technology in scanning of soft tissues such as brain tissue, liver tissue, tumor tissue and the like. It has been reported in the literatures that Micro-MRI is used as a quantitative and qualitative indicator to evaluate the edema and adhesion of local soft tissues. Micro-MRI can be used for microvascular imaging and in vivo imaging of pyramidal tract transduction pathway in presence of a contrast agent. In the field of peripheral neuroscience, Micro-MRI can be used to evaluate the repairing of peripheral nerve injury in animal models, and quantitatively measure the T1 and T2 values of local peripheral nerve, thereby reflecting the nerve regeneration. However, there is no relevant research currently available for obtaining the images of fascicular structure of peripheral nerve by Micro-MRI, and its application potential remains to be further explored.

SUMMARY

To solve the above problems to obtain high-quality consecutively scanned images of fascicular structure of peripheral nerve, without destroying the morphology and physical and chemical properties of a peripheral nerve sample, so as to obtain a more precise three-dimensional structural model of the peripheral nerve sample than does in the prior art, the present invention provides a method for three-dimensional reconstruction of fascicular structure of human peripheral nerve, by immersing a fresh peripheral nerve sample into a liquid directly, scanning the peripheral nerve sample by Micro-MRI to acquire image data, and obtaining a visual structural model of the peripheral nerve sample by means of three-dimensional reconstruction based on the image data.

The present invention provides a method for three-dimensional reconstruction of fascicular structure of human peripheral nerve, comprising the steps of:

S1. obtaining a human peripheral nerve, and preparing a peripheral nerve sample;

S2. immersing the peripheral nerve sample into a liquid;

S3. setting scan parameters of Micro-MRI, and scanning the peripheral nerve sample by Micro-MRI, to acquire image data of the peripheral nerve sample in the liquid environment; and S4. obtaining a visual structural model of the peripheral nerve sample by means of three-dimensional reconstruction based on the image data.

Preferably, in the step S1, the preparation of the peripheral nerve sample comprises one or more of the following steps: trimming the fresh peripheral nerve to remove peripheral free adipose tissue; and cutting the peripheral nerve into segments with a length of 2-2.5 cm.

Preferably, in the step S2, the liquid is distilled water or a contrast agent.

Preferably, the contrast agent is a contrast agent solution having a concentration of 0.1-0.2%.

Preferably, the contrast agent solution is prepared by mixing gadopentetate dimeglumine with an iodine agent at a volume ratio of 1:500.

Preferably, in the step S3, the image data comprise consecutively scanned images of the cross sections of the peripheral nerve sample.

Preferably, when scanning the cross sections of the peripheral nerve sample, the scan parameters of Micro-MRI are set as follows:
slice orientation: transaxial; number of slices: 25; slices thickness: 1 mm; inter-slice gap: 0.1 mm; horizontal Field of view: 15 mm; vertical Field of view: 15 mm; # phase encodings: 300; # sample: 300; pixel size: 0.05 mm; and number of excitations: 50.

Preferably, in the step S3, the image data further comprise consecutively scanned images of the sagittal sections and/or coronal sections of the peripheral nerve sample.

Preferably, when scanning the sagittal sections and/or coronal sections of the peripheral nerve sample, the scan parameters of Micro-MRI are set as follows:
slice orientation: coronal/sagittal; number of slices: 13; slices thickness: 1 mm; inter-slice gap: 0.1 mm; horizontal field of view: 12 mm; vertical field of view: 25 mm; # phase encodings: 240; # sample: 500; pixel size: 0.05 mm; and number of excitations: 50.

The method for three-dimensional reconstruction of fascicular structure of human peripheral nerve described in the present invention provides a new approach to morphological observation of the internal structure of nerves, and is superior to the prior art. The preparation of the peripheral nerve sample is simple and needs no special pre-treatment, so as to minimize the image distortion. The cross sections at different positions of the entire peripheral nerve sample can be consecutively scanned by Micro-MRI in an easy, efficient and convenient way. The morphology of the sample remain stable during the scanning process, and the resulting images are of excellent quality and high accuracy, facilitating the three-dimensional reconstruction of the sample, without destroying the morphology and physical and chemical properties of the sample, such that the peripheral nerve sample can be reused after being scanned. The present invention can provide a technical support for the three-dimensional reconstruction and analysis of fascicular structure of a long segment of peripheral nerve, further provide preoperative guidance for clinical peripheral nerve reconstruction and repairing surgery, and also provide more accurate template information for 3D printing of nerve repair materials.

BRIEF DESCRIPTION OF THE DRAWINGS

FIG. 1 shows a flow chart of a method for three-dimensional reconstruction of fascicular structure of human peripheral nerve according to an embodiment of the present invention.

FIGS. 2A1, 2A2, and 2A3 respectively show the images of the cross section, sagittal section and coronal section of a peripheral nerve sample in the presence of a contrast agent scanned by Micro-MRI with T1 weighted according to an embodiment of the present invention.

FIGS. 2B1, 2B2, and 2B3 respectively show the images of the cross section, sagittal section and coronal section of a peripheral nerve sample in the presence of a contrast agent scanned by Micro-MRI with T2 weighted according to an embodiment of the present invention.

FIGS. 2C1, 2C2, and 2C3 respectively show the images of the cross section, sagittal section and coronal section of a peripheral nerve sample in the presence of distilled water scanned by Micro-MRI with T1 weighted according to an embodiment of the present invention.

FIGS. 2D1, 2D2, and 2D3 respectively show the images of the cross section, sagittal section and coronal section of a peripheral nerve sample in the presence of distilled water scanned by Micro-MRI with T2 weighted according to an embodiment of the present invention.

FIG. 3A shows two-dimensional images of a peripheral nerve sample consecutively scanned by Micro-MRI according to an embodiment of the present invention.

FIG. 3B and FIG. 3C show the three-dimensional reconstruction of the peripheral nerve sample based on the two-dimensional images in FIG. 3A according to an embodiment of the present invention.

DESCRIPTION OF THE EMBODIMENTS

Figure 4A:
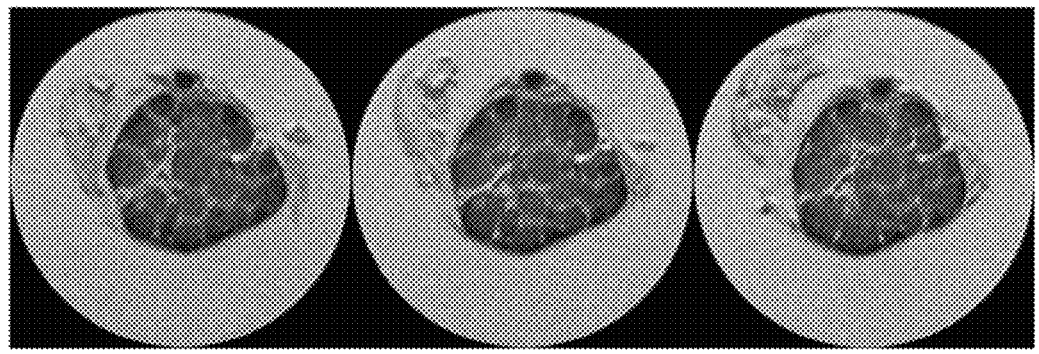
FIG. 4A shows a first set of images of three different cross sections of a peripheral nerve sample scanned by Micro-MRI according to an embodiment of the present invention.

To make the technical problems, the technical solutions and advantageous effects of the present invention more clearly, the present invention will be described in further detail below with reference to the accompanying drawings and embodiments. It is to be understood that the specific embodiments described herein are merely illustrative of and are not intended to limit the present invention.

The present embodiment provides a method for three-dimensional reconstruction of fascicular structure of human peripheral nerve. FIG. 1 shows the main process of the method according to the present embodiment, which comprises mainly the steps of:

obtaining human peripheral nerve, and preparing a peripheral nerve sample;

immersing the peripheral nerve sample into a liquid;

setting scan parameters of Micro-MRI, and scanning the peripheral nerve sample by Micro-MRI, to acquire image data of the peripheral nerve sample in the liquid environment; and three-dimensional reconstructing a visual structural model of the peripheral nerve sample based on the image data.

Specifically, the method according to the present embodiment comprises the steps as follows.

Firstly, a human peripheral nerve is obtained, and a peripheral nerve sample is prepared.

A fresh human peripheral nerve is obtained, and the peripheral nerve is trimmed to remove the peripheral free adipose tissue. Then, the trimmed peripheral nerve is cut into short segments with a length of about 2.5 cm, to produce peripheral nerve samples that are then labeled respectively.

Secondly, the peripheral nerve sample to be scanned is immersed into a liquid.

A centrifuge tube is charged with the peripheral nerve sample, filled with a liquid and sealed, with air bubbles therein evacuated. The centrifuge tube charged with the peripheral nerve sample is placed in Micro-MRI (Aspect imaging M3) head coil, securely fixed and then the coil is installed. Preferably, the liquid used to immerse the peripheral nerve sample is distilled water or a contrast agent. More preferably, the contrast agent is a contrast agent solution having a concentration of 0.2%, which is obtained by dissolving 0.1 ml of gadopentetate dimeglumine into 50 ml of an iodine agent (where the iodine agent is only used as an organic solvent for dissolving the contrast agent).

Thirdly, scan parameters of Micro-MRI are set, and the peripheral nerve sample is scanned by Micro-MRI, to acquire image data of the peripheral nerve sample in the liquid environment.

The scan parameters of Micro-MRI are set, and two-dimensional images of the cross-sections of the peripheral nerve sample are consecutively scanned with T1 or T2 weighted, wherein the parameters are set as follows:
Slice orientation: transaxial
Number of slices: 25
Slices thickness: 1 mm;
Inter-slice gap: 0.1 mm;
Horizontal field of view (Hor. FOV): 15 mm;
Vertical field of view (Vert. FOV): 15 mm;
Phase encodings: 300;
Sample: 300;
Pixel size: 0.05 mm; and
Number of excitations: 50.

Preferably, the scan parameters are further set as required, and two-dimensional images of the sagittal sections and coronal sections of the peripheral nerve are consecutively scanned with T1 or T2 weighted, where the parameters are set as follows:
Slice orientation: coronal/sagittal
Number of slices: 13
Slices thickness: 1 mm;
Inter-slice gap: 0.1 mm;
Horizontal field of view: 12 mm;
Vertical field of view: 25 mm;
Phase encodings: 240;
Sample: 500;
Pixel size: 0.05 mm; and
Number of excitations: 50.

The consecutively scanned two-dimensional images of the peripheral nerve sample are obtained, for example, as shown in FIGS. 2A1 to 2D3. FIGS. 2A1, 2A2 and 2A3 illustratively show images of the cross-section, sagittal section and coronal section of the peripheral nerve sample in the presence of a contrast agent (gadolinium agent) scanned with T1 weighted, respectively. FIGS. 2B1, 2B2 and 2B3 illustratively show images of the cross-section, sagittal section and coronal section of the peripheral nerve sample in the presence of a contrast agent (gadolinium agent) scanned with T2 weighted, respectively. FIGS. 2C1, 2C2 and 2C3 illustratively show images of the cross-section, sagittal section and coronal section of the peripheral nerve sample in the presence of distilled water scanned with T1 weighted, respectively. FIGS. 2D1, 2D2 and 2D3 illustratively show images of the cross-section, sagittal section and coronal section of the peripheral nerve sample in the presence of distilled water scanned with T2 weighted, respectively.

Fourthly, a visual structural model of the peripheral nerve sample is obtained by means of three-dimensional reconstruction based on the image data.

The peripheral nerve sample is recovered for reuse. The two-dimensional images (see FIG. 3A) consecutively scanned in the third step are used for three-dimensional reconstruction by using three-dimensional reconstruction software. The nerve fascicles shown in each two-dimensional image of FIG. 3A are segmented and extracted, and then the topological structure of the nerve fascicles is presented by visualization, as shown in FIGS. 3B and 3C. FIG. 3B shows a reconstructed model of the peripheral nerve sample. Each of the nerve fascicles can be observed and analyzed independently, thereby clearly exhibiting the changes in the intersection and fusion of the nerve fascicles. The peripheral nerve fascicles extending in four different manners are shown in FIG. 3B by examples. FIG. 3C shows the reconstructed model of the peripheral nerve sample viewed from different angles (left, right, top and bottom).

Moreover, it's found through comparison that the images of the peripheral nerve sample that is immersed in the contrast agent and scanned with T1 weighted present a relatively better quality.

Figure 4B:
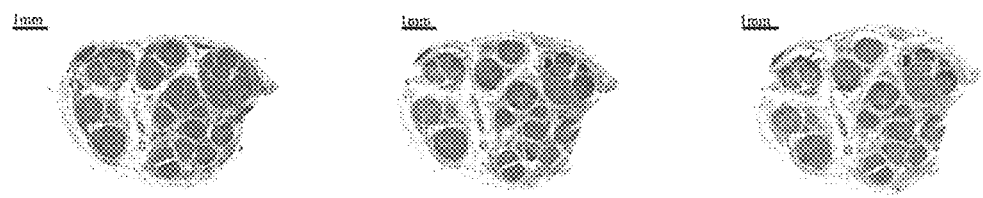
FIG. 4B shows a second set of images of the three different cross sections of the peripheral nerve sample of FIG. 4A stained with H&E.
Figure 4C:
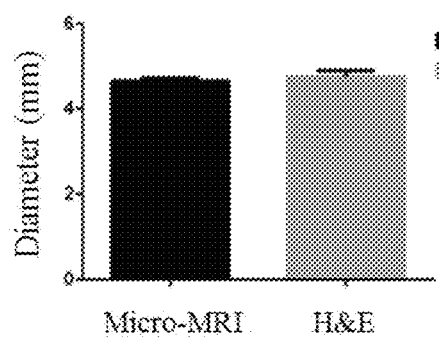
FIG. 4C and FIG. 4D show comparisons between the image data of FIG. 4A and the image data of FIG. 4A.
Figure 4D:
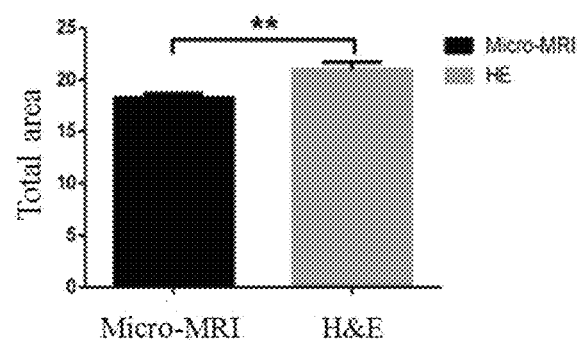

Furthermore, the peripheral nerve sample recovered in the above embodiment is sectioned and stained with H&E to obtain images of the cross sections of the peripheral nerve sample as a reference group. The images of the cross sections of the peripheral nerve sample obtained in the above embodiment according to the present invention are compared to the reference group, as shown in FIG. 4A to 4D. FIG. 4A shows a first set of images of three different cross sections of the peripheral nerve sample scanned by Micro-MRI. FIG. 4B shows a second set of images of the three different cross sections of the peripheral nerve sample stained with H&E. FIGS. 4C and 4D compares of the diameters and total areas of the peripheral nerve sample in the two sets of images, respectively. It is found through comparison that the consecutively scanned images of the peripheral nerve obtained by Micro-MRI (compared to traditional histological sections) have better image stability and less sample deformation.

The above description is merely preferred specific embodiments of the present invention, and the scope of the present invention is not limited thereto. Any variation or equivalent substitution to the detailed descriptions will be obvious to those skilled in the art without departing from the technical scope disclosed herein and such variations and equivalent substitutions are within the scope of the present invention.

What is claimed is:

1. A method for three-dimensional reconstruction of fascicular structure of human peripheral nerve, comprising the steps of:
   S1. obtaining a human peripheral nerve, and preparing a peripheral nerve sample;
   S2. immersing the peripheral nerve sample into a liquid;
   S3. setting scan parameters of Micro-MRI, and scanning the peripheral nerve sample by Micro-MRI, to acquire image data of the peripheral nerve sample in the liquid environment; and
   S4. obtaining a visual structural model of the peripheral nerve sample by means of three-dimensional reconstruction based on the image data;
   wherein the step S1, the preparation of the peripheral nerve sample comprises one or more of the following steps:
   trimming the fresh peripheral nerve to remove peripheral free adipose tissue;
   cutting the peripheral nerve into segments with a length of 2-2.5 cm.

2. The method for three-dimensional reconstruction of fascicular structure of human peripheral nerve according to claim 1, wherein in the step S2, the liquid is distilled water or a contrast agent.

3. The method for three-dimensional reconstruction of fascicular structure of human peripheral nerve according to claim 2, wherein the contrast agent is a contrast agent solution having a concentration of 0.1-0.2%.

4. The method for three-dimensional reconstruction of fascicular structure of human peripheral nerve according to claim 3, wherein the contrast agent solution is prepared by mixing gadopentetate dimeglumine with an iodine agent at a volume ratio of 1:500.

5. The method for three-dimensional reconstruction of fascicular structure of human peripheral nerve according to claim 1, wherein in the step S3, the image data comprises consecutively scanned images of the cross sections of the peripheral nerve sample.

6. The method for three-dimensional reconstruction of fascicular structure of human peripheral nerve according to claim 5, wherein when scanning the cross sections of the peripheral nerve sample, the scan parameters of Micro-MRI are set as follows:

slice orientation: transaxial; number of slices: 25; slices thickness: 1 mm; inter-slice gap: 0.1 mm; horizontal field of view: 15 mm; vertical field of view: 15 mm; # phase encodings: 300; # sample: 300; pixel size: 0.05 mm; and number of excitations: 50.

7. The method for three-dimensional reconstruction of fascicular structure of human peripheral nerve according to claim 5, wherein in the step S3, the image data further comprises consecutively scanned images of the sagittal sections and/or coronal sections of the peripheral nerve sample.

8. The method for three-dimensional reconstruction of fascicular structure of human peripheral nerve according to claim 7, wherein when scanning the sagittal sections and/or coronal sections of the peripheral nerve sample, the scan parameters of Micro-MRI are set as follows:

slice orientation: coronal/sagittal; number of slices: 13; slices thickness: 1 mm; inter-slice gap: 0.1 mm; horizontal field of view: 12 mm; vertical field of view: 25 mm; # phase encodings: 240; # sample: 500; pixel size: 0.05 mm; and number of excitations: 50.

* * * * *